United States Patent
Chen et al.

(10) Patent No.: US 12,374,572 B2
(45) Date of Patent: *Jul. 29, 2025

(54) SYSTEMS AND METHODS FOR SYSTEMATIC PHYSICAL FAILURE ANALYSIS (PFA) FAULT LOCALIZATION

(71) Applicant: Taiwan Semiconductor Manufacturing Co., Ltd., Hsinchu (TW)

(72) Inventors: Peng-Ren Chen, Hsinchu (TW); Wen-Hao Cheng, Hsinchu (TW); Jyun-Hong Chen, Hsinchu (TW); Chien-Hui Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/679,252

(22) Filed: May 30, 2024

(65) Prior Publication Data
US 2024/0321613 A1 Sep. 26, 2024

Related U.S. Application Data

(63) Continuation of application No. 18/163,821, filed on Feb. 2, 2023, now Pat. No. 12,027,396, which is a
(Continued)

(51) Int. Cl.
*H01L 21/67* (2006.01)
*H01L 21/66* (2006.01)

(52) U.S. Cl.
CPC ........ *H01L 21/67288* (2013.01); *H01L 22/14* (2013.01)

(58) Field of Classification Search
CPC ... H01L 21/67288; H01L 22/14; H01L 22/20; H01L 22/30; G01R 31/2851; G01R 31/31835; G01R 31/318357; G06N 20/00
See application file for complete search history.

(56) References Cited

U.S. PATENT DOCUMENTS

| | | | |
|---|---|---|---|
| 11,600,505 B2 * | 3/2023 | Chen | H01L 22/20 |
| 12,027,396 B2 * | 7/2024 | Chen | H01L 21/67288 |

(Continued)

FOREIGN PATENT DOCUMENTS

| | | |
|---|---|---|
| KR | 20080003456 A | 1/2008 |
| KR | 20100044902 A | 4/2010 |

(Continued)

*Primary Examiner* — John P. Dulka
(74) *Attorney, Agent, or Firm* — Seed IP Law Group LLP

(57) ABSTRACT

Systematic fault localization systems and methods are provided which utilize computational GDS-assisted navigation to accelerate physical fault analysis to identify systematic fault locations and patterns. In some embodiments, a method includes detecting a plurality of electrical fault regions of a plurality of dies of a semiconductor wafer. Decomposed Graphic Database System (GDS) cross-layer clips are generated which are associated with the plurality of electrical fault regions. A plurality of cross-layer common patterns is identified based on the decomposed GDS cross-layer clips. Normalized differentials may be determined for each of the cross-layer common patterns, and locations of hotspots in each of the dies may be identified based on the determined normalized differentials.

20 Claims, 8 Drawing Sheets

Related U.S. Application Data continuation of application No. 16/527,435, filed on Jul. 31, 2019, now Pat. No. 11,600,505.

(60) Provisional application No. 62/753,658, filed on Oct. 31, 2018.

(56) References Cited

U.S. PATENT DOCUMENTS

| | | |
|---|---|---|
| 2017/0084016 A1 | 3/2017 | Chen et al. |
| 2017/0309009 A1 | 10/2017 | Haque et al. |
| 2018/0165803 A1* | 6/2018 | Cheng .................... H01L 22/20 |

FOREIGN PATENT DOCUMENTS

| | | |
|---|---|---|
| KR | 20130055014 A | 5/2013 |
| TW | 201712774 A | 4/2017 |
| TW | 201740104 A | 11/2017 |

* cited by examiner

SYSTEMS AND METHODS FOR SYSTEMATIC PHYSICAL FAILURE ANALYSIS (PFA) FAULT LOCALIZATION

BACKGROUND

In semiconductor device manufacturing, dies on a semiconductor wafer may be tested, for example, by physical failure analysis (PFA), to determine causes of certain defects that may exist in the dies. Defects may be related to many causes, including for example, flaws in the design of the die as well as flaws in the manufacturing processes used to manufacture the die.

Physical failure analysis (PFA) typically entails probing the die with a wafer testing apparatus. By applying known electric test vectors and tracing the test vectors through the circuitry in the die, failure regions can be identified. Once a failure region is identified, additional steps such as manual net tracing are performed to determine a layer in which the failures occur. Next, PFA samples are selected, typically based on the judgment of engineers, and the physical samples are analyzed in a lab to pinpoint the cause of the failures. This may involve a variety of time-intensive procedures, such as top lapping, cutting, cross-sectioning, etching, physical delayering, and the like, in order to diagnose the root cause of the failure. Moreover, these procedures are typically performed over a relatively large region of the semiconductor die, as the failure regions generally cannot be precisely located with conventional techniques.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
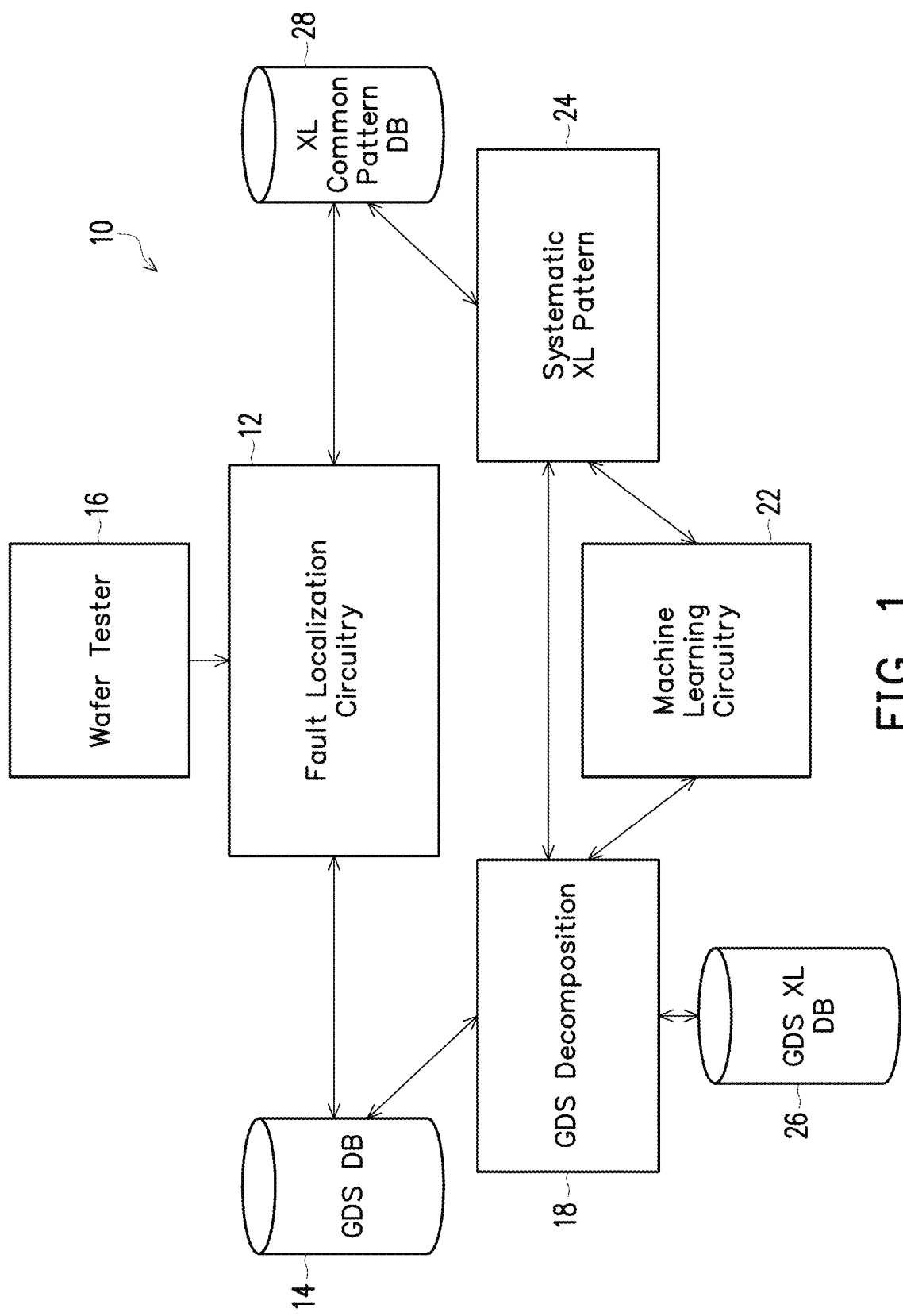
FIG. 1 is a block diagram illustrating a systematic fault localization system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provided herein include systematic fault localization and methods that facilitate identification of systematic hotspots or faults in semiconductor dies which may include a plurality of different layers, cells, interconnections, and the like. In some embodiments, cross-layer pattern decomposition and normalized differential analysis of cross-layer (XL) common patterns across full-chip regions are utilized in GDS-assisted systems and methods to identify systematic hotspots with high precision, e.g., the specific locations of systematic hotspots may be identified within sub-regions of an electric fail net region. In some embodiments, the present disclosure facilitates analysis of electric faults by which an area of a first region (e.g., a wafer or a single die) is analyzed and systematic hotspots may be determined to be within a sub-region (e.g., within a region matching a XL common pattern) that is greater than 5,000 times smaller than the analyzed region. For example, an analyzed region may have more than 4000 cells or a cumulated area of greater than 100,000 $\mu m^2$, and the identified systematic hotspot location regions may have a size of about 4 cells or less than about 20 $\mu m^2$. This exemplifies a 5000×PFA fault search area reduction, and provides a significant advantage over conventional techniques in which only a large electric fail net region may be identified, and physical processes are performed over the entire electric fail net region in an attempt to locate the precise position of the failure.

Embodiments of the present disclosure further facilitate significant improvements in physical failure analysis cycle time, since systematic faults or hotspots may be precisely located, thereby reducing or eliminating the complicated physical search for faults in a large area.

In an electronic circuit design process, one or more electronic design automation (EDA) tools may be utilized to design, optimize, and verify semiconductor device designs, such as circuit designs in a semiconductor device, such as a semiconductor chip. A register-transfer level (RTL) design of a circuit may be performed, for example, by software tools which utilize a high-level software language (e.g., Verilog, or the like) to describe or otherwise model the circuit. The RTL design may then proceed to a synthesis process, in which the RTL design may be translated to an equivalent hardware or circuit-level implementation file. The synthesis results may then be used by placement and routing tools to create a physical layout of the semiconductor device (e.g., a semiconductor chip). During placement, a placer tool may produce a placement layout based on the synthesized circuit design. The placement layout includes information indicating physical positions of various circuit elements of the semiconductor device. For example, the placer tool may generate a plurality of cells which correspond to, or otherwise implement, the various circuit elements of the semiconductor device. The cells may include geometric shapes which correspond to various features of semiconductor devices, including, for example, diffusion layers, polysilicon layers, metal layers, and/or interconnections between layers.

After the placement of the device is completed, clock-tree synthesis (CTS) may be performed, in which a clock tree is developed to distribute (e.g., by electrical networks) clock signals from a common point to all of the circuit elements that are to receive a clock signal. Routing is typically performed after CTS. During routing, wires or interconnections may be formed to connect the various circuit elements of the placement layout.

After routing, various checks and analysis are performed on the design of the placement layout, including, for example, design rule checks (DRCs), design rule verification, timing analysis, critical path analysis, static and dynamic voltage drop analysis, and the like. A tape-out process is then performed and optical masks are developed to fabricate the semiconductor device or circuit. During the tape-out process, the database file of the circuit (e.g., an integrated circuit (IC)) is converted into a Graphic Database System (GDS) file which is used to make various layers of masks for manufacturing the IC.

Defect detection processes may be implemented as part of the semiconductor manufacturing process to detect defects on wafers according to GDS files.

In various embodiments, the present disclosure provides systems, apparatuses, and methods for automatically identifying or detecting defects on a semiconductor wafer during physical failure analysis (PFA). Such defects may include hotspots, which may result from various defects, such as insufficient space and/or line width margins, or the like.

FIG. 1 is a block diagram illustrating a systematic fault localization system 10, in accordance with embodiments of the present disclosure. The systematic fault localization system 10 includes fault localization circuitry 12 and a Graphic Database System (GDS) database 14. The fault localization circuitry 12 may include, or otherwise be executed by, a computer processor configured to perform the various functions and operations described herein. For example, the fault localization circuitry 12 may be executed by a computer processor selectively activated or reconfigured by a stored computer program, or may be a specially constructed computing platform for carrying out the features and operations described herein.

In some embodiments, the fault localization circuitry 12 includes memory which stores instructions for performing one or more of the features or operations described herein, and the fault localization circuitry 12 may be operable to execute instructions stored, for example, in the memory to perform the functions of the fault localization circuitry 12 described herein. The memory may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The systematic fault localization system 10 may further include a physical wafer test apparatus 16, which may be referred to herein as a wafer tester 16. The wafer tester 16 may be any conventional wafer test apparatus which may be utilized in physical failure analysis. For example, the wafer tester 16 may be or include a wafer prober which may apply one or more electrical test patterns to each of a plurality of dies on a semiconductor wafer. The wafer tester 16 may determine whether each of the dies on the wafer is a good die or a bad die based on an analysis of the dies during application of the one or more test patterns. In some embodiments of the present disclosure, the wafer tester 16 may determine an area on each of the bad dies where a defect is located. However, as will be described in further detail below, in one or more embodiments, further analysis which is guided by the GDS files related to the dies is performed (e.g., by the fault localization circuitry 12) to determine with high precision a specific location of the defects in the bad dies.

Figure 2:
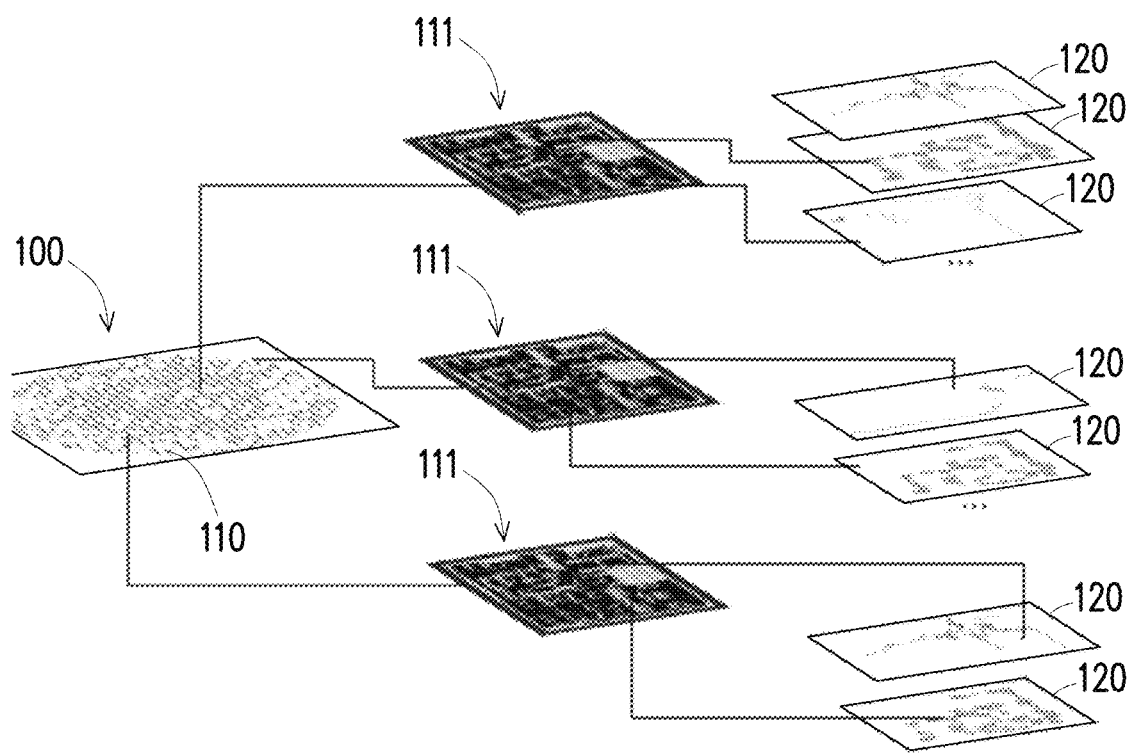
FIG. 2 is a schematic diagram illustrating a semiconductor wafer and fail net regions in bad dies of the semiconductor wafer, in accordance with some embodiments.

FIG. 2 illustrates a semiconductor wafer 100 which may be inspected, for example, by the systematic fault localization system 10 shown in FIG. 1, in accordance with embodiments of the present disclosure.

The semiconductor wafer 100 includes a plurality of semiconductor dies 110. A same functional circuit or integrated circuit (IC) may be formed on each of the dies 110, and the dies 110 may thus be substantially the same as one another. However, due to various factors, such as design factors related to errors in the design of the dies 110, as well as manufacturing or process factors, some of the dies 110 may have physical defects which result in physical failure of the dies 110, such as hotspots.

The semiconductor wafer 100 may be inspected to detect defects on the dies 110, for example, by the wafer tester 16. If defects are not detected in a particular die, for example, as a result of an electric test applied to the die by the wafer tester 16, then the die may be determined to be a good die. On the other hand, if one or more defects are detected in a die 110, then the die 110 may be determined to be a bad die 111. Examples of bad dies 111 on the semiconductor wafer 100 are shown in an enlarged view in FIG. 2. The wafer tester 16 may detect defects in a die 110, for example, by diagnosing electric failure nets in the wafer 100, which may include applying electrical test vectors to the wafer 100 to diagnose or detect the bad dies 111 on the wafer 100.

In some embodiments, the wafer tester 16 may determine an area or region within the bad die 111 within which the defect is determined to exist. For example, the wafer tester 16 may determine coordinates indicating the area or region of the hotspot on the particular bad die 111. The coordinates may indicate a location of one or more fail net regions (e.g., regions on the wafer where electrical faults are diagnosed as being present). Information related to the detected defects or hotspots may be provided to the fault localization circuitry 12, for example, by the wafer tester 16. Such information may include, for example, the locations of the determined hotspots, or the locations of the fail net regions (which may also be referred to herein as electric fault nets or electric failure nets). As shown in FIG. 2, each bad die 111 may include one or more fail net regions 120, which are areas or regions of the bad dies 111 in which a hotspot is diagnosed as being present.

Referring again to FIG. 1, the GDS database 14 may store information associated with the plurality of dies 110 formed on the semiconductor wafer 100. More particularly, the GDS database 14 may store the database or GDS files of the IC, which are used to make the dies 110. The information associated with the dies 110 stored in the GDS database 14 may thus include information indicating physical positions of various circuit elements (which may be represented by cells), as well as electrical interconnections between cells and any other features of the semiconductor device.

In some embodiments, the fault localization circuitry 12 may retrieve information stored in the GDS database 14 based on the information received from the wafer tester 16, such as information from the wafer tester 16 which indicates locations of the detected fail net regions 120 in the bad dies 111.

In some embodiments, the fault localization circuitry 12 may project the locations of the detected fail net regions 120 in the bad dies 111 on to the Graphic Database System (GDS) to generate GDS clips of interconnected cells in the electric fault regions or fail net regions 120. For example, the fault localization circuitry 12 may retrieve GDS files or clips from the GDS database 14 that are associated with the detected fail net regions 120 that are detected in the bad dies 111, and the GDS files or clips may include layout information of cells (which represent, for example, one or more circuit devices in the dies 110) in the fail net regions 120, as well as any other information associated with the detected fail net regions 120 including, for example, diffusion layers, polysilicon layers, metal layers, and/or interconnections between layers. The GDS files or clips retrieved from the GDS database 14 may thus include a plurality of different, separate GDS files or clips for a same fail net region 120, with each such separate GDS file or clip representing a particular layer among a plurality of different layers of the die (e.g., diffusion layers, polysilicon layers, metal layers, interconnection layers, or the like), and in some embodiments, each of the separate GDS files or clips may represent a particular mask layer which is used to form the plurality of different layers, cells, interconnections, and the like. For example, since a die 110 is formed of a plurality of different layers, cells, interconnections, and the like, each mask layer may be represented as a separate GDS file or clip which is used to manufacture the die 110. For any particular region (including, for example, a fail net region 120 of a bad die 111), a plurality of different layers may be present on the die 110, including layers having different cells, interconnections, or the like. Accordingly, the fault localization circuitry 12 may retrieve a plurality of GDS files or clips from the GDS database 14 for each fail net region 120, with each of the plurality of retrieved GDS files or clips representing a particular mask layer of the bad die 111 in the fail net region 120.

In some embodiments, the systematic fault localization system 10 may decompose the retrieved GDS files or clips to generate GDS cross-layer (XL) clips. This may be accomplished, for example, by a GDS decomposition tool 18 which may receive the GDS files or clips associated with the fail net regions 120 directly from the GDS database 14 or from the fault localization circuitry 12. The GDS decomposition tool 18 may be implemented at least in part as a software tool accessible to and executable by one or more computing devices, processors or the like. The GDS database 14 may be stored, for example, in any computer-readable storage medium.

Figure 3:
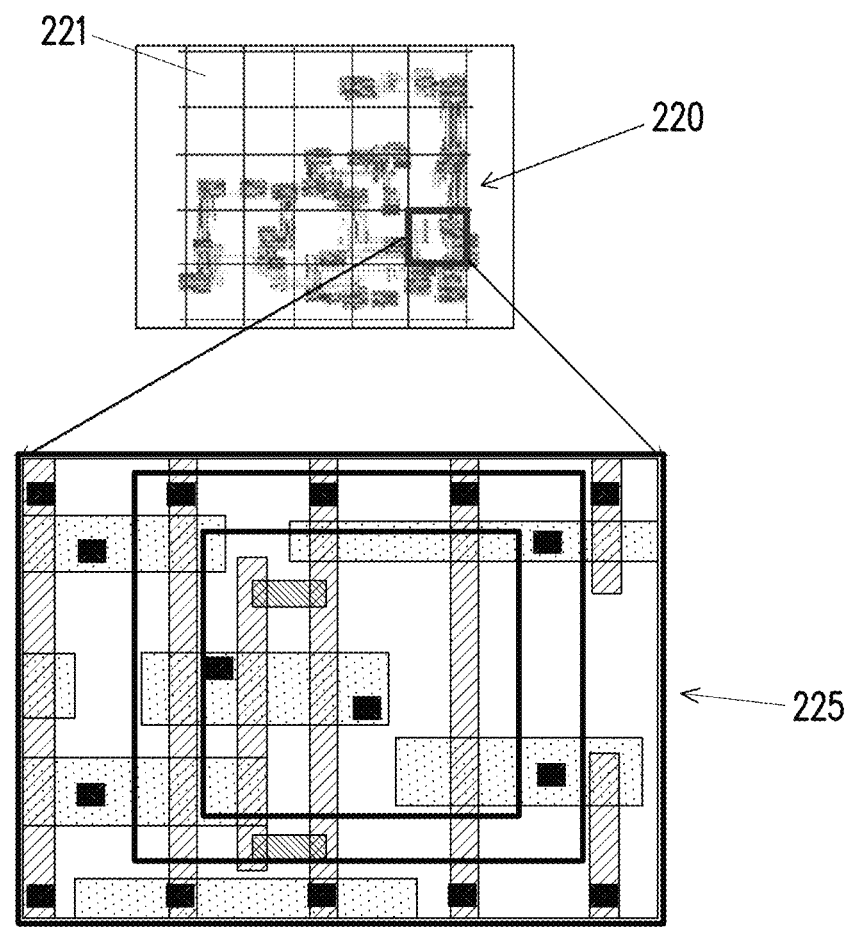
FIG. 3 is a diagram illustrating decomposition of a Graphic Database System (GDS) clip to generate a corresponding GDS cross-layer clip, in accordance with some embodiments.

FIG. 3 is a diagram that illustrates decomposition of a retrieved GDS clip 220 associated with a fail net region 120 of a bad die 111 to generate a corresponding GDS XL clip 225 representative of the fail net region 120.

In some embodiments, the GDS decomposition tool 18 may generate merged GDS clips by merging a plurality of retrieved GDS files or clips which each represent a particular layer of the bad die 111 in the fail net region 120. As will be discussed in further detail with respect to FIG. 3, the merged GDS clips may be decomposed by the GDS decomposition tool 18 into a plurality of GDS XL clips, each of which GDS XL clips is smaller than, and may be a subset of, a set of merged GDS clips which represent the various layers of the fail net region 120. For example, a merged GDS clip may represent all of the layers of a die in a particular fail net region 120, while each of the GDS XL clips may represent all of the layers of the die in a sub-region of the fail net region 120.

As shown in FIG. 3, a GDS clip 220 that is associated with a particular fail net region 120 of a bad die 111 may be retrieved from the GDS database 14. In some embodiments, the GDS clip 220 shown in FIG. 3 may be a merged GDS clip, in which a plurality of layers of the bad die 111 in the fail net region 120 are merged together to form a merged GDS clip 220. In some embodiments, the GDS clip 220 may be retrieved by the fault localization circuitry 12, for example, based on the information received from the wafer tester 16 indicating a location of the fail net region 120 on the bad die 111. The GDS clip 220 may then be transmitted from the fault localization circuitry 12 to the GDS decomposition tool 18 for decomposition and generation of a corresponding GDS XL clip 225. In other embodiments, the GDS file 220 may be retrieved by the GDS decomposition tool 18 directly from the GDS database 14.

The GDS decomposition tool 18 may decompose the merged GDS clips 220 to form the GDS cross-layer (XL) clips 225 from the interconnected cells in the fail net regions 120. In some embodiments, the GDS clips 220 associated with each of the fail net regions 120 of the bad die 111 may be partitioned, e.g., by the GDS decomposition tool 18 into a grid having a plurality of grid regions 221, as shown in FIG. 3. Each grid region 221 of the GDS clips 220 may be separately analyzed by the GDS decomposition tool 18, and a separate GDS XL clip 225 may be generated for each of the analyzed grid regions 221. For example, the GDS decomposition tool 18 may decompose the merged GDS clips 220 by dividing each of the merged GDS clips 220 into a plurality of GDS XL clips 225. Each of the GDS XL clips 225 may be stored, for example, in a GDS XL clip database 26. The GDS XL clip database 26 may be stored, for example, in any computer-readable storage medium.

In some embodiments, the systematic fault localization system 10 may include machine learning circuitry 22, which may implement a pattern recognition method or a kernel method to obtain or identify cross-layer (XL) common patterns based on the GDS cross-layer (XL) clips 225 from the interconnected cells in the fail net regions 120.

In machine learning, kernel methods are a class of algorithms for pattern analysis, which may be utilized to recognize patterns and regularities in data, and which may be utilized to find relations (e.g., clusters, correlations, classifications, etc.) in datasets. The GDS decomposition tool 18 and/or the machine learning circuitry 22 of the systematic fault localization system 10 may obtain or identify the XL common patterns based on the decomposed GDS XL clips 225 by employing one or more artificial intelligence or machine learning techniques, which may be implemented at least in part by the machine learning circuitry 22 and which in some embodiments may be implemented by applying a pattern recognition or a kernel method. The pattern recognition or kernel method may be performed automatically by the GDS decomposition tool 18 and/or the machine learning circuitry 22, for example, in response to receiving a decomposed GDS XL clip 225 from the GDS XL database 26.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as placement layouts. Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions.

The GDS decomposition tool 18 and/or the machine learning circuitry 22 may employ, for example, neural network, deep learning, convolutional neural network, Bayesian program learning, support vector machines, Markov logic networks, pattern recognition techniques, or any logical or statistical machine learning approach or algorithm to identify XL common patterns based on the decomposed GDS XL clips 225. Further, the GDS decomposition tool 18 and/or the machine learning circuitry 22 may implement any one or combination of the following computational algorithms and/or techniques: classification, regression, supervised learning, unsupervised learning, feature learning, clustering, decision trees, or the like. The GDS decomposition tool 18 and/or machine learning circuitry 22 may employ one or more computationally intelligent and/or machine learning techniques to implement or perform any of the functionalities described herein with respect to the GDS decomposition tool 18 and/or machine learning circuitry 22, including, for example, to obtain or identify XL common patterns based on the decomposed GDS XL clips 225.

In various embodiments, the GDS decomposition tool 18 and/or the machine learning circuitry 22 may utilize logical or statistical machine learning approaches or algorithms to develop, train, and/or update a GDS XL clip pattern recognition or pattern matching model which may be utilized to determine "matches" based on similarity between decomposed GDS XL clips. As an example, a Bayesian network may be utilized by the GDS decomposition tool 18 and/or the machine learning circuitry 22 to develop a model which may be utilized to determine matches based on similarity between decomposed GDS XL clips. A Bayesian network is a probabilistic graphical model that represents a set of variables and their conditional dependencies via a directed acyclic graph. For example, a Bayesian network may represent the probabilistic relationships between the interconnected cells in regions of a die and the presence of defects. Given input data (e.g., in the form of decomposed GDS XL clips 225), the network may be utilized to determine or predict a likelihood of the presence of defects in the input data, and further may be utilized to obtain or identify XL common patterns based on similarities between decomposed GDS XL clips 225.

In some embodiments, the decomposed GDS XL clips 225 may be analyzed to obtain or generate the XL common patterns by a systematic XL pattern tool 24, as will be discussed in further detail later herein.

The machine learning circuitry 22 may be implemented in one or more processors having access to instructions, which may be stored in any computer-readable storage medium, which may be executed by the machine learning circuitry 22 to perform any of the operations or functions described herein.

In some embodiments, the systematic fault localization system 10 may identify the occurrence of systematic electric faults based on the identified fail net regions 120, in which one or more hotspots are diagnosed as being present. The systematic electric faults may be determined or identified prior to the generation of GDS XL clips 225, in some embodiments. For example, after obtaining the defect signals of the bad dies 111 which indicate a location of identified hotspots, a hotspot distribution may be obtained by stacking the hotspots or hotspot regions of the bad dies 111 in the wafer 100 according to the identified locations (e.g., coordinates of the bad dies 111 indicating a hot spot location or region). In this way, the locations of hotspots may be accumulated, such that particular regions (e.g., electric fail net regions 120) of the bad dies 111 where hotspots systematically occur may be identified. That is, systematic hotspots may refer to hotspots which occur in corresponding or same regions of more than one bad die 111. These systematic hotspots may be identified by stacking the hotspots or hotspot regions (including, for example, by stacking the electric fail regions 120) of the bad dies 111 to generate a distribution of hotspot or electric fail net regions 120, and determining the presence of a systematic hotspots based on the distribution. For example, systematic hotspots may be determined to exist in a region of the dies 110 if one or more hotspots are identified in the same or corresponding region of a plurality of the bad dies 111.

In this way, the fail net regions 120 which are identified as including systematic hotspots may be analyzed by the GDS decomposition tool 18. For example, the GDS decomposition tool 18 may receive GDS clips 220 associated with only the fail net regions 120 which are identified as including systematic hotspots, and such GDS clips 220 indicative of systematic hotspots may be merged and then decomposed to form the decomposed GDS XL clips 225.

In some embodiments, a distribution of locations of electrical faults (or hotspots) may be identified in the decomposed GDS XL clips 225 of interconnected cells in electric fault or fail net regions 120, for example, by the GDS decomposition tool 18 and/or the machine learning circuitry 22. The distribution of locations of electrical faults or hotspots may be obtained using the following equation:

$$S(x_k, y_k, XL) = \text{Stack}_{all\ failed\ nets} DC(x_k, y_k, XLayers) = \sum_{j=1}^{N_{bad-die}} DC_{all\ failed\ nets}(D_j, x_k, XLayers)$$

For each die 110 of the semiconductor wafer 100, the distribution can be represented as a function DC(D, x, y, XLayer), where D indicates a particular die 110 of the wafer 100 in which a hotspot is located, x and y indicate coordinates of the hotspot in the die 110, and XLayer indicates a particular cross-layer (e.g., a diffusion layer, polysilicon layer, metal layer, interconnection layer, or the like) in which the hotspot is detected. The distribution of hotspots of decomposed GDS XL clips 225 may be represented by a summation of the hotspot locations (e.g., positions of hotspots) for each layer of each diagnosed bad die ($N_{bad-die}$).

In some embodiments, the decomposed GDS XL clips 225 may be analyzed to obtain or generate cross-layer (XL) common patterns. In some embodiments, this may be performed by a systematic XL pattern tool 24 which may be included in the systematic fault localization system 10 shown in FIG. 1. The systematic XL pattern tool 24 may receive the GDS XL clips 225 from the GDS decomposition tool 18 and/or the machine learning circuitry 22. The systematic XL pattern tool 24 may be implemented at least in part as a software tool accessible to and executable by one or more computing devices, processors or the like.

In some embodiments, cross-layer (XL) common patterns are obtained or generated based on the decomposed GDS XL clips 225 of interconnected cells in the fail net regions 120. For example, the XL common patterns may be GDS XL clips 225 or portions of GDS XL clips 225 which are determined to be common for the dies 110, and more particularly, which are determined to be common among fail net regions 120 of the bad dies 111. As such, the XL common patterns may represent XL patterns which are associated with systematic hotspots or locations, regions, or patterns of the bad dies 111 which commonly exhibit hotspots or other failures.

Figure 4:
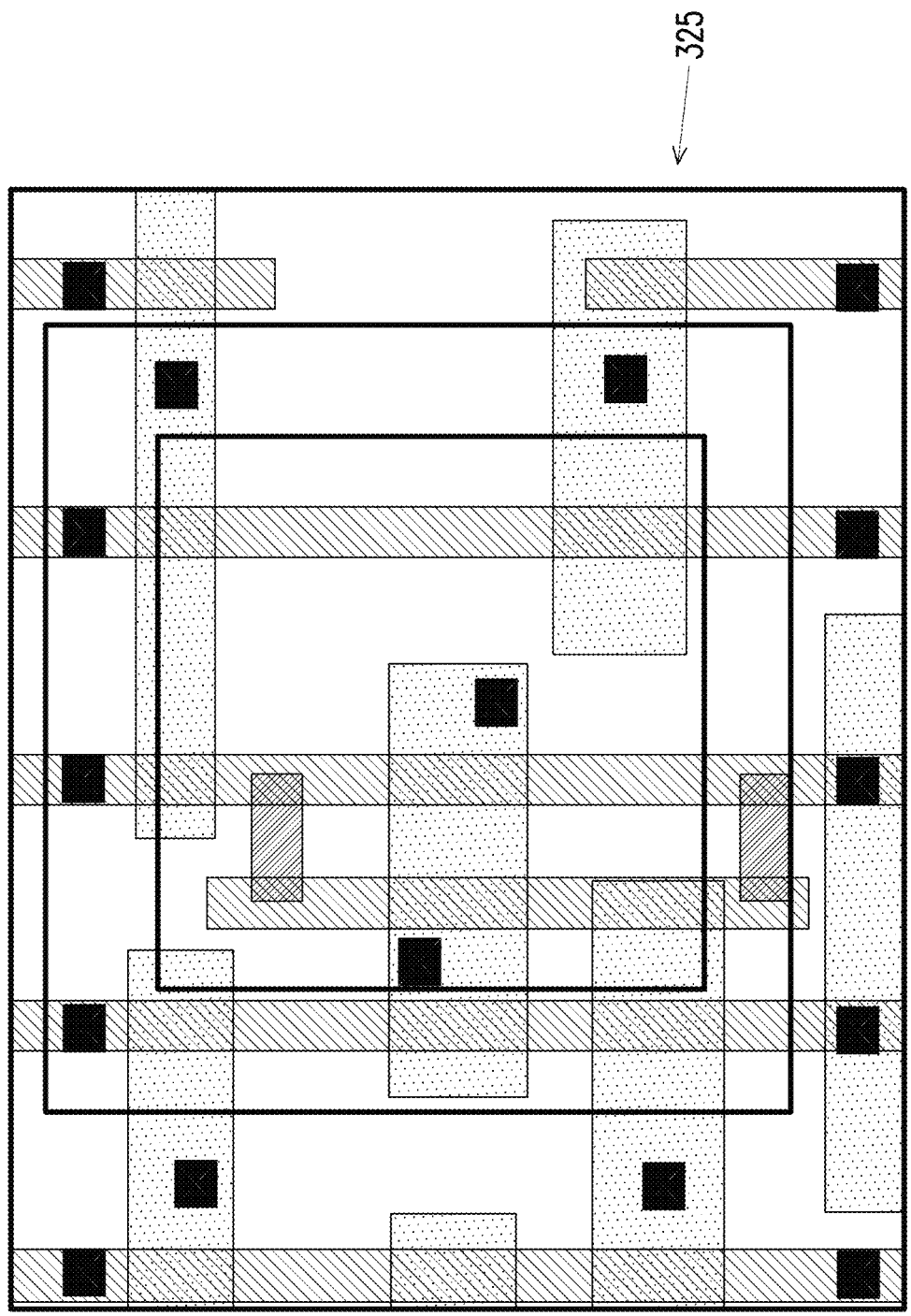
FIG. 4 is a diagram illustrating a cross-layer common pattern, in accordance with some embodiments.

FIG. 4 is a diagram illustrating a XL common pattern 325. The XL common pattern 325 shown in FIG. 4 may be substantially the same as the GDS XL clip 225 shown in FIG. 3. For example, if the GDS XL clip 225 is determined, e.g., by the systematic XL pattern tool 24, to have characteristics which match those of one or more other GDS XL clips (e.g., as may be stored in the GDS XL clip database 26), then it may be selected as a XL common pattern 325 for the dies 110.

The XL common patterns may be identified by a pattern matching method, as previously described herein, and the XL common patterns may be classified and grouped by XL common pattern type. The pattern matching method may be implemented by the systematic XL pattern tool 24 and/or the machine learning circuitry 22. Pattern matching generally refers to the act of checking data for the presence of the constituents of some pattern. The systematic XL pattern tool 24 and/or the machine learning circuitry 22 may thus analyze each of the GDS XL clips in the GDS XL clip database 26 to identify XL common patterns.

For example, in some embodiments, the systematic XL pattern tool 24 and/or the machine learning circuitry 22 may compare each GDS XL clip 225 in the GDS XL clip database 26 to all of the other GDS XL clips 225 in the GDS XL clip database 26 to identify XL common patterns. In some embodiments, the systematic XL pattern tool 24 and/or the machine learning circuitry 22 may implement a machine learning pattern recognition approach to automatically recognize patterns in the GDS XL clips 225 and to thus identify XL common patterns based on the recognized patterns. For example, where a same pattern is recognized as occurring in a plurality of different GDS XL clips 225, then that pattern may be identified as a XL common pattern. In some embodiments, XL common patterns may be identified based on a trained GDS XL clip pattern recognition or pattern matching model, as discussed previously herein.

The identified XL common patterns 325 may be stored in the XL common pattern database 28, which may be stored, for example, in any computer-readable medium.

In some embodiments, a normalized differential analysis is performed for a full chip normalized XL pattern type. A normalized differential for each XL common pattern type may be determined using the following equation:

Normalized Differential of $i_{th}$ XL Common Pattern type :=

$$\tilde{\Delta}_i = \frac{CP_i}{\sum_{j=1}^{N} CP_j}\bigg|_{ElectricFaultRegion} - \frac{CP_i}{\sum_{j=1}^{N} CP_j}\bigg|_{Full\text{-}ChipRegion},$$

where:
CP:=Common Pattern grouped by Pattern Matching, and
N:=Total number of CP type.

Each XL common pattern associated with an electric fault region (e.g., the fail net regions 120) may be compared with all other XL common patterns associated with the electric fault region, and a ratio may be calculated. This may be performed, for example, by the systematic XL pattern tool 24 and/or the machine learning circuitry 22. For example, once the XL common patterns 325 have been identified and stored in the XL common pattern database 28, the systematic XL pattern tool 24 and/or the machine learning circuitry 22 may access the XL common patterns 325 one at a time and may compare each of the XL common patterns 325 with all of the other XL common patterns 325 for the dies 110.

Similarly, each XL common pattern may be compared with all other XL common patterns across the full chip (e.g., all common patterns located anywhere on the bad die 111), and a ratio may be calculated. A difference between the ratio of the XL common pattern with respect to the electric fault region and the ratio of the XL common pattern with respect to the full chip region may be calculated as the normalized differential for a particular (e.g., ith) XL common pattern type.

Figure 5:
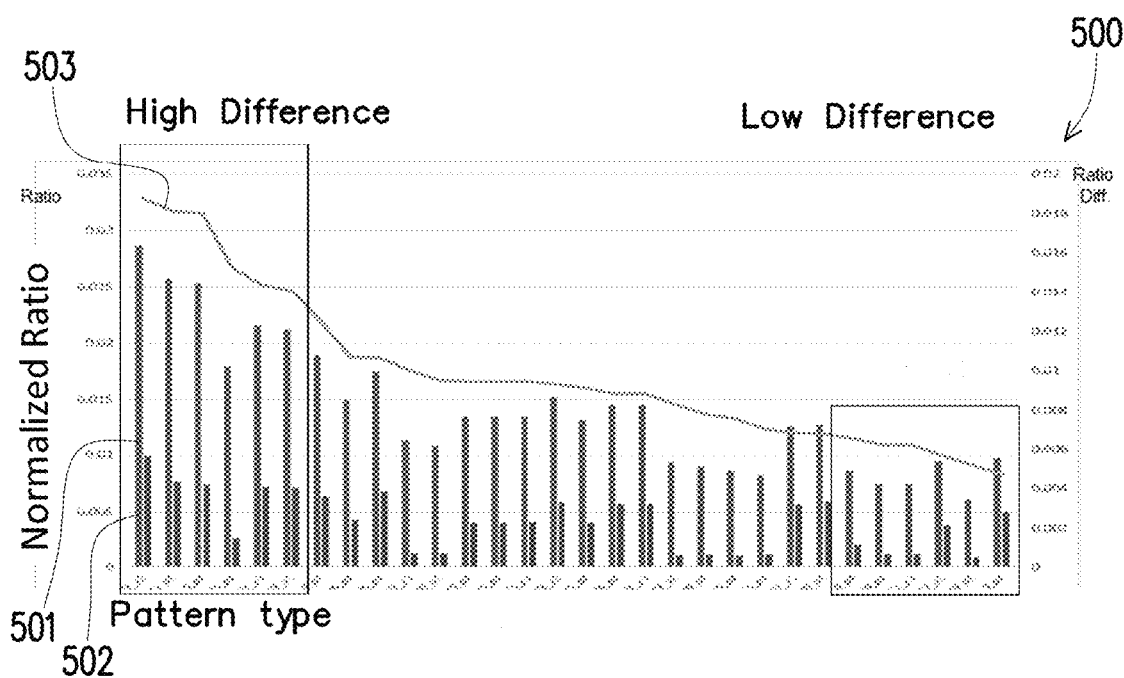
FIG. 5 is a chart illustrating normalized differentials for a plurality of cross-layer common patterns, in accordance with some embodiments.

FIG. 5 is a chart 500 illustrating the normalized differentials for a plurality of XL common patterns which may be generated and utilized, for example, by the systematic XL pattern tool 24 and/or the machine learning circuitry 22.

The chart 500 shows a normalized ratio (y-axis) for a plurality of XL common patterns (x-axis). More particularly, for each XL common pattern situated along the x-axis of the chart 500, two normalized ratios are shown: a first normalized ratio 501 which indicates the comparison of each of the XL common patterns to all of the other XL common patterns in an electric fault region, and a second normalized ratio 502 which indicates the comparison of the XL common pattern to all of the other XL common patterns across the entire full chip region (e.g., across the entire bad die 111).

Each of the first normalized ratios 501 shown in the chart 500 thus represents the ratio of a particular XL common pattern (i.e., the i-th XL common pattern) of a fail net region 120 with respect to all other XL common patterns of the fail net region 120. The first normalized ratio 501 thus represents the first term in the normalized differential equation, as follows:

$$\frac{CP_i}{\sum_{j=1}^{N} CP_j}\bigg|_{ElectricFaultRegion}$$

Similarly, each of the second normalized ratios 502 shown in the chart 500 represents the ratio of a particular XL common pattern (i.e., the i-th XL common pattern) with respect to all other XL common patterns of the full chip region. The second normalized ratio 502 represents the second term in the normalized differential equation, as follows:

$$\frac{CP_i}{\sum_{j=1}^{N} CP_j}\bigg|_{Full\text{-}ChipRegion}$$

Also shown in the chart 500 is the normalized differential 503 between the first normalized ratio 501 and the second normalized ratio 502 for each XL common pattern. The normalized differential 503 thus represents the difference between the first normalized ratio 501 and the second normalized ratio 502, or, $\Delta_i$ from the equation above.

A relatively high normalized differential 503 for a particular XL common pattern indicates that the XL common pattern represents a systematic fault or systematic hotspot. This is shown in the region labeled "high difference" in the chart 500 of FIG. 5. For example, if the first normalized ratio 501 for a particular XL common pattern is high, this indicates that the XL common pattern has a high degree of correlation with other XL common patterns of fail net regions 120. That is, the XL common pattern is highly correlated with the fail net regions 120. At the same time, if the second normalized ratio 502 is low, this indicates that the particular XL common pattern is not highly correlated with the other regions of the full chip. Thus, when the normalized differential 503 is high for a particular XL common pattern, there is a high likelihood that the XL common pattern is associated with a systematic fault or hotspot, since it is highly associated with fail net regions and very weakly associated with other (e.g., normal) regions of the full chip.

Similarly, a relatively low normalized differential 503 for a particular XL common pattern indicates that the XL common pattern may not represent a systematic fault or systematic hotspot. This is shown in the region labeled "low difference" in the chart 500 of FIG. 5. For example, if the first normalized ratio 501 for a particular XL common pattern is low, this indicates that the XL common pattern has a low degree of correlation with other XL common patterns of fail net regions 120. That is, the XL common pattern is relatively weakly correlated with the fail net regions 120. At the same time, if the second normalized ratio 502 is high (or more particularly, if the second normalized ratio 502 is close to the first normalized ratio 501), this indicates that the particular XL common pattern is relatively highly correlated with the other regions of the full chip (or that it is nearly as closely related to XL common patterns associated with other, non-fault regions of the die as it is to XL common patterns associated with fail net regions 120). Thus, when the normalized differential 503 is low for a particular XL common pattern, there is a lower likelihood that the XL common pattern is associated with a systematic fault or hotspot, since it is relatively weakly associated with fail net regions and as compared with other (e.g., normal) regions of the full chip.

In some embodiments, the normalized differential 503 may be compared to a threshold value, for example, by the systematic XL pattern tool 24. The threshold value may be any value for a normalized differential 503, which may be selected depending on design considerations. For example, the threshold value may be selected based on a desired sensitivity for determining systematic hotspots. The systematic XL pattern tool 24 may compare the normalized differential 503 for each XL common pattern to the threshold, and may determine that the XL common patterns indicates the presence of a systematic fault or hotspot if the normalized differential 503 exceeds the threshold value. Thus, if the threshold value is set at a relatively high value, then only those XL common patterns having a relatively high normalized differential 503 will be determined to be representative of systematic faults or hotspots. This will result in only XL common patterns that are strongly associated with fail net regions 120 and weakly associated with the full chip regions as being identified as representative of systematic faults or hotspots. Accordingly, the threshold value sets a sensitivity at which the systematic XL pattern tool 24 determines a XL common pattern represents systematic faults or hotspots.

When a particular XL common pattern is identified as representing a systematic fault or hotspot location, then the XL common pattern may be classified as a systematic fault or hotspot XL common pattern and stored, for example, in the XL common pattern database 28. Moreover, the fault localization circuitry 12 may scan the entire full chip (e.g., an entire die 110) for other regions or sub-regions having the exact match with the particular XL common pattern, which may indicate a systematic fault or hotspot in the other regions or sub-regions of the full chip. In some embodiments, regions or sub-regions of the full chip may be scanned for a close match to identify locations of hotspots in the full chip. For example, the fault localization circuitry 12 and/or the machine learning circuitry 22 may scan regions or sub-regions of the full chip for close matches by implementing a fuzzy match algorithm, or the like. A fuzzy match algorithm may be any known algorithm which identifies matches that may be less than 100% perfect when finding correspondences between data, such as data indicative of patterns in regions or sub-regions of a chip. Scanning of the entire full chip for regions or sub-regions having the exact (or close) match with a particular XL common pattern may be performed, for example, by the fault localization circuitry 12, which may access the particular XL common pattern which represents a systematic fault or hotspot from the XL common pattern database 28, and further may access the GDS files stored in the GDS database 14 to compare the XL common pattern with all other regions of the dies 110.

The fault localization circuitry 12 may thus generate a systematic fault or hotspot distribution for each of the dies 110, for example, by scanning the dies 110 for regions which match the XL common patterns that are indicate of systematic faults or hotspots. When a match is found, then that region of the dies 110 is indicated in the distribution as containing a systematic fault or hotspot, so that the distribution indicates locations of systematic faults or hotspots in each of the dies 110.

In some embodiments, the fault localization circuitry 12 may obtain a systematic fault or hotspot distribution among all of the dies 110 (or among all of the bad dies 111) of the wafer 100. In some embodiments, the systematic fault or hotspot distribution may be generated for dies 110 across a plurality of different semiconductor wafers 100. For example, the dies 110 of a plurality of different wafers may be analyzed to find regions which match one or more XL common patterns that are indicative of systematic faults or hotspots, and a systematic fault or hotspot distribution for all of the dies 110 of the plurality of wafers 100 may thus be produced.

Figure 6:
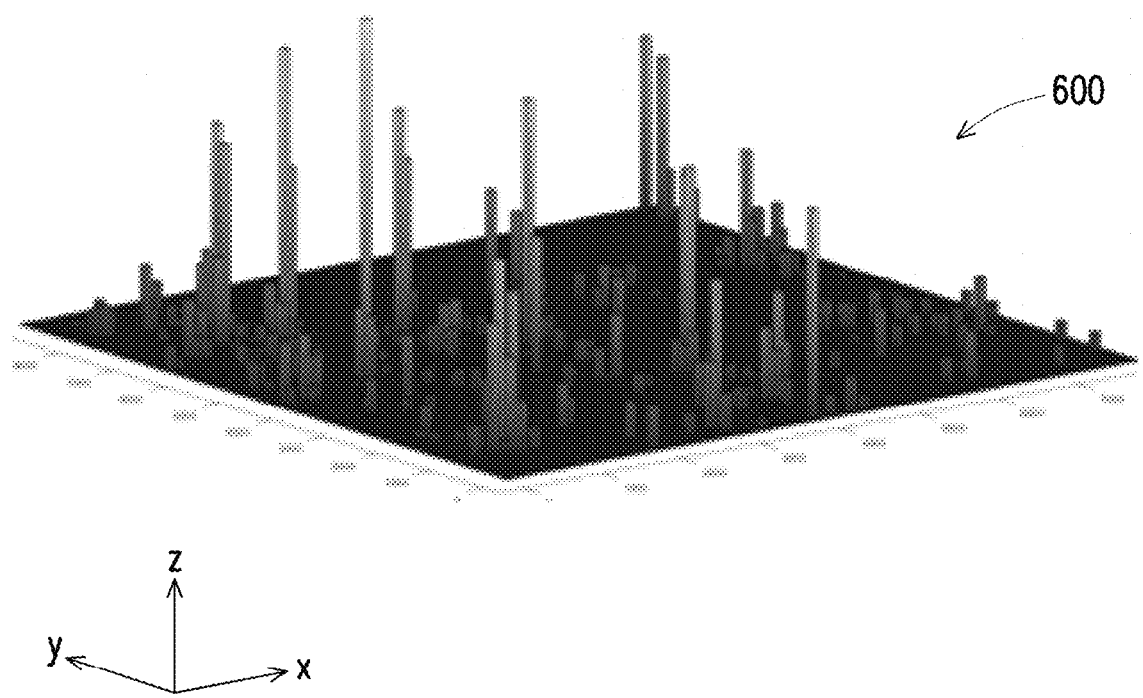
FIG. 6 is a diagram illustrating a systematic hotspot distribution for a plurality of dies, in accordance with some embodiments.

FIG. 6 is a diagram illustrating a systematic hotspot distribution 600 for a plurality of dies 110. The systematic hotspot distribution 600 may be generated by stacking the plurality of dies 110 and identifying locations among all of the stacked dies 110 where systematic hotspots occur. In some embodiments, the systematic hotspot distribution 600 is generated by stacking dies 110 of a plurality of wafers 100.

The systematic hotspot distribution 600 may be a three-dimensional distribution having x-axis and y-axis coordinates which indicate a position or location of the systematic hotspots, and a z-axis coordinate which indicates a frequency or number of occurrences of systematic hotspots at each location among the multiple dies 110. Accordingly, positions of the dies 110 (e.g., x-axis and y-axis location coordinates) which exhibit a high number of systematic hotspots have values on the z-axis of the hotspot distribution 600 which indicate the high number of systematic hotspots for those positions.

In some embodiments, the systematic hotspot distribution 600 may be utilized to identify flaws in the design or manufacturing processes of the dies 110. For example, in some embodiments, positions of systematic hotspots, as may be indicated in the systematic hotspot distribution 600, may be further investigated, for example, by performing physical delayering or the like of the bad dies 111 to pinpoint the cause of the systematic hotspots. In other embodiments, the positions of the systematic hotspots may be utilized to modify the design layout for the dies 110, so that a next batch of dies on a semiconductor wafer 100 may be designed to avoid the systematic hotspots that were identified. In some embodiments, the XL common patterns which are indicative of systematic hotspots may be utilized as feedback to a design process, so that future designs may avoid the presence of such systematic hotspots.

Figure 7:
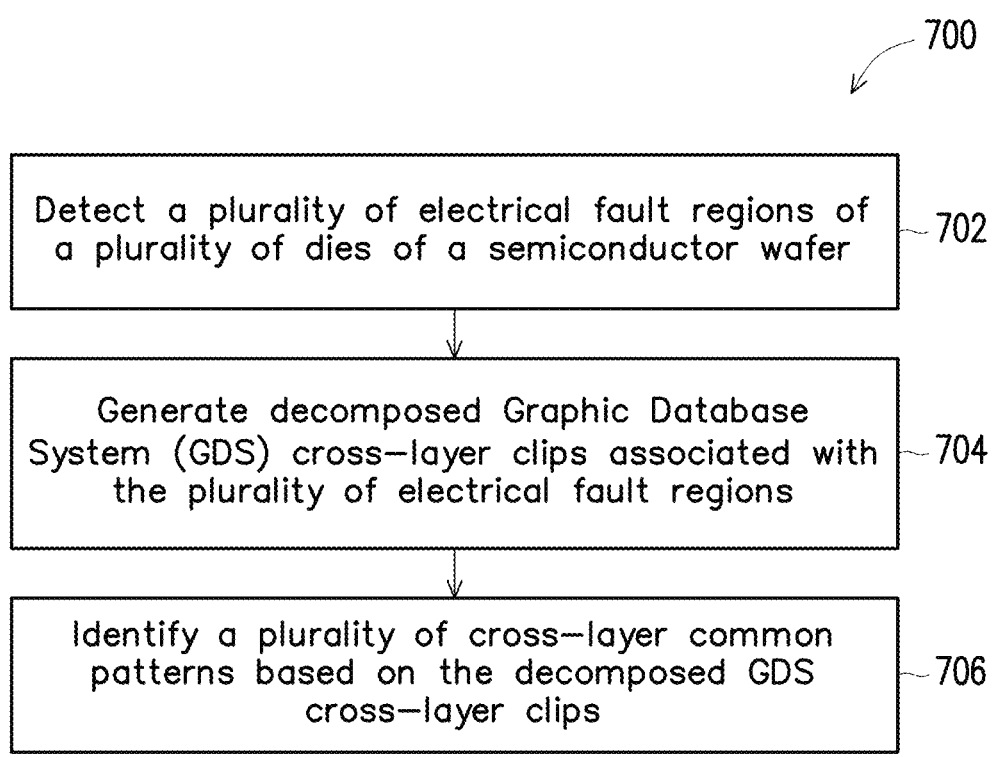
FIG. 7 is a flowchart illustrating a systematic fault localization method, in accordance with some embodiments.

FIG. 7 is a flowchart illustrating a systematic fault localization method 700. At 702, the method includes detecting a plurality of electrical fault regions 120 of a plurality of dies 110 of a semiconductor wafer 100. In some embodiments, the electrical fault regions 120 are detected in response to electrical test vectors which may be applied by a wafer testing apparatus 16.

At 704, the method includes generating decomposed Graphic Database System (GDS) cross-layer clips 225 associated with the plurality of electrical fault regions 120. In some embodiments, the GDS cross-layer clips 225 are generated by accessing, from a GDS database 14, GDS clips associated with the electrical fault regions 120, and each of the GDS clips may represent a particular layer of the dies 110 in the electrical fault regions 120. In some embodiments, merged GDS clips are generated for the electrical fault regions 120 by merging the GDS clips associated with the electrical fault regions 120. In some embodiments, generating the decomposed GDS cross-layer clips 225 includes dividing the merged GDS clips into a plurality of separate decomposed GDS cross-layer clips 225.

At 706, the method includes identifying a plurality of cross-layer common patterns 325 based on the decomposed GDS cross-layer clips 225. In some embodiments, identifying the cross-layer common patterns 325 includes identifying matching patterns among the decomposed GDS cross-layer clips 225. In some embodiments, each of the cross-layer common patterns 325 may be compared with all of the cross-layer common patterns, and a first normalized ratio may be calculated based on the comparison. The first normalized ratio may indicate a similarity between each of the cross-layer common patterns with respect to all other cross-layer common patterns. In some embodiments, each of the cross-layer common patterns may further be compared across a full chip region of each of the dies, and a second normalized ratio may be calculated based on the comparison. In some embodiments, a normalized differential for each of the cross-layer common patterns is determined by subtracting the second normalized ratio from the first normalized ratio. The method may further include identifying locations of hotspots in each of the dies based on the determined normalized differentials.

Figure 8:
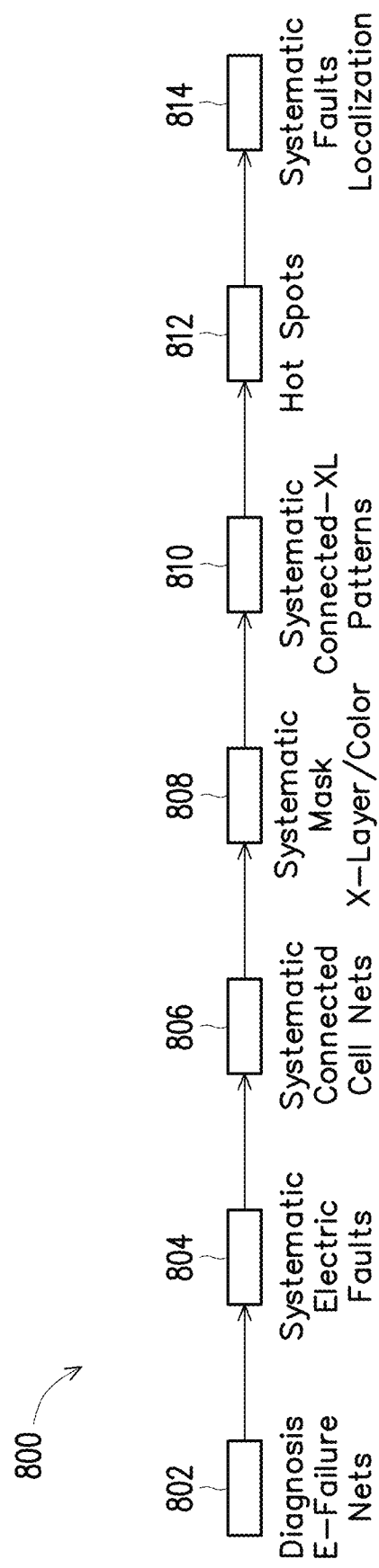
FIG. 8 is a flowchart illustrating a systematic physical fault analysis (PFA) method, in accordance with some embodiments.

FIG. 8 is a flowchart illustrating a systematic physical fault analysis (PFA) method 800. At 802, the method includes diagnosing electric failure nets in a wafer 100. Diagnosing the electric failure nets at 802 may include, for example, applying electrical test vectors to the wafer 100 to diagnose or detect the bad dies 111 on the wafer 100. For example, as shown in and described above with respect to FIGS. 1 and 2, the wafer tester 16 may be utilized to apply electrical test vectors to the wafer 100, and may diagnose electric failure nets (e.g., as may be present in the diagnosed bad dies 111) in the wafer 100 based on the applied electrical test vectors.

At 804, the method includes identifying systematic electric faults in the wafer 100. Identifying the systematic electric faults may include, for example, determining areas or regions within the bad dies 111 within which a defect (e.g., the diagnosed electric failure nets or fail net regions 120) is determined to exist. For example, the wafer tester 16 may determine an area or region within the bad dies 111 within which the defect is determined to exist, and the area or region may be determined by coordinates which indicate a location of one or more electrical failure nets or fail net regions (e.g., regions on the wafer where electrical faults are diagnosed as being present).

At 806, the method includes identifying systematic connected cell nets which are associated with the systematic electric faults. For example, the systematic connected cell nets may be identified by retrieving GDS files or clips stored in the GDS database 14 that are associated with the identified systematic electric faults or the fail net regions 120. The retrieved GDS files or clips may include layout information of cells in the fail net regions 120, as well as any other information associated with the detected fail net regions 120 including, for example, diffusion layers, polysilicon layers, metal layers, and/or interconnections between layers. The GDS files or clips retrieved from the GDS database 14 may include a plurality of different, separate GDS files or clips for a same fail net region 120, with each of the separate GDS files or clips representing a particular layer, mask layer, or mask color layer which is used to form the plurality of different layers, cells, interconnections, and the like. For any particular fail net region 120, a plurality of different layers may be present on the die 110, including layers having different cells, interconnections, or the like. Accordingly, each of the plurality of retrieved GDS files or clips for a particular fail net region 120 may represent a particular layer, mask layer, or mask color layer of a bad die 111 in the fail net region 120.

At 808, the method includes identifying systematic layers, mask cross-layers, or mask color cross-layers associated with the diagnosed electric failure nets or detected fail net regions 120. Identifying systematic layers or mask cross-layers may include generating a GDS cross-layer (XL) clip 225, for example, as shown in and described with respect to FIG. 3. The GDS XL clip 225 may be generated by dividing the merged GDS clips associated with the fail net regions 120 to form a plurality of GDS cross-layer (XL) clips 225 as described previously herein.

At 810, the method includes identifying systematic connected cross-layer (XL) patterns. Identifying systematic connected XL patterns may include generating systematic connected XL patterns (which may be referred to herein as XL common patterns) based on the decomposed GDS XL clips 225, as previously described herein. For example, the XL common patterns may be GDS XL clips 225 or portions of GDS XL clips 225 which are determined to be common among fail net regions 120 of the bad dies 111, for example, by pattern matching. The XL common patterns may thus represent XL patterns which are associated with systematic hotspots or locations, regions, or patterns of the bad dies 111 which commonly exhibit hotspots or other failures. In some embodiments, identifying systematic connected XL patterns at 810 may include performing a normalized differential analysis for each XL common pattern and determining a difference (e.g., the normalized differential 503), for each XL common pattern, between a ratio of the XL common pattern with respect to the electric fault region and a ratio of the XL common pattern with respect to the full chip region. Identifying the systematic connected XL patterns may further include comparing the normalized differentials 503 for the identified systematic connected XL patterns to one or more threshold values to identify XL common patterns that are representative of systematic hotspots in the bad dies 111. When a particular XL common pattern is identified as representing a systematic fault or hotspot location, then the XL common pattern may be classified as a systematic fault or hotspot XL common pattern and stored, for example, in the XL common pattern database 28.

At 812, the method includes identifying systematic hotspots in the bad dies 111 of the wafer 100. Identifying systematic hotspots at 812 may include scanning the entire full chip (e.g., an entire die 110) to identify regions or sub-regions of the chip which match with one or more of the XL common patterns, or the systematic fault or hotspot XL common patterns. Such matching regions or sub-regions of the chip may thus be identified as including a systematic fault or hotspot.

At 814, the method includes systematic faults localization, which may include identifying locations of the systematic faults or hotspots. Systematic faults localization may further include generating a systematic fault or hotspot distribution for each of the dies 110, and may further include performing die stacking to obtain a systematic fault or hotspot distribution 600 among all of the bad dies 111 of the wafer 100. The systematic hotspot distribution 600 may be a three-dimensional distribution, and positions of the dies 110 (e.g., x-axis and y-axis location coordinates) which exhibit a high number of systematic hotspots have values on the z-axis of the hotspot distribution 600 which indicate the high number of systematic hotspots for those positions. In some embodiments, the systematic hotspot distribution 600 may be utilized to determine priorities for physical delayering and further examination of the physical locations of the identified hotspot locations. For example, locations of the bad dies 111 having a high number of systematic hotspots may be assigned a higher priority for physical delayering, so that those locations will be examined by the physical delayering process before other locations which have fewer numbers of systematic hotspots. In some embodiments, the positions of the systematic hotspots and/or the systematic hotspot distribution 600 may be provided as direct feedback to a design process, so that the electronic design of the dies 100 (including, for example, the GDS files) may be adjusted to avoid the presence of such systematic hotspots. This may be referred to as virtual physical failure analysis (PFA), as the failure analysis may be performed without physical sample delayering processes, and the electronic design may be adjusted based on the computational systematic PFA fault localization obtained as described herein.

Embodiments of the present disclosure provide several advantages. For example, in some embodiments, systematic hotspots or faults may be identified as existing in particular semiconductor device patterns, which may include a plurality of different layers, cells, interconnections, and the like. By utilizing cross-layer pattern decomposition and normalized differential analysis of XL common patterns across full-chip regions, systematic hotspots may be identified with high precision, e.g., the specific locations of systematic hotspots may be identified within sub-regions of an electric fail net region. In some embodiments, the present disclosure facilitates analysis of electric faults by which an area of a first region (e.g., a wafer or a single die) is analyzed and systematic hotspots may be determined to be within a sub-region (e.g., within a region matching a XL common pattern) that is greater than 5,000 times smaller than the analyzed region. For example, an analyzed region may have more than 4000 cells or a cumulated area of greater than 100,000 $\mu m^2$, and the identified systematic hotspot location regions may have a size of about 4 cells or less than about 20 $\mu m^2$. This provides a significant advantage over conventional techniques in which only an electric fail net region may be identified, and physical processes are performed over the entire electric fail net region in an attempt to locate the precise position of the failure.

Embodiments of the present disclosure further facilitate significant improvements in physical failure analysis cycle time, since systematic faults or hotspots may be precisely located, thereby reducing or eliminating the complicated physical search for faults in a large area. In conventional physical failure analysis processes, the cycle time is more than 3 or 4 days, whereas embodiments of the present disclosure facilitate PFA cycle times which are at least 30% faster. Moreover, the number of systematic faults or hotspots may be reduced in subsequent dies, as the XL common patterns which yield faults or hotspots may be utilized to update existing semiconductor die designs and may further be utilized to avoid such faults or hotspots in future designs.

The present disclosure provides, in various embodiments, systems and methods which utilize computational GDS-assisted navigation to accelerate physical fault analysis to identify systematic fault locations and patterns. Computational procedures may be applied to sequentially funnel down or narrow down from a large electric diagnosis scan area (e.g., a full wafer area) to pinpoint device yield and systematic functional fault sub-regions, which may include integrating both diagnosis systems (e.g., a wafer tester or wafer probe) and Graphic Database System (GDS) or Graphic Design System. This drastically speeds up PFA cycle times and accelerates yield learning, which may refer to the process of identifying and eliminating sources of faults in an electronic design until a suitable number of manufactured chips implementing the electronic design function according to design specifications. In some embodiments, virtual PFA is provided in which systematic faults or hotspots may be identified in an electronic design, and the electronic design may be adjusted based to reduce or eliminate the identified systematic faults or hotspots without physical sample delayering preparation processes.

In some embodiments, electric failure nets are diagnosed, for example, by analysis of semiconductor dies in response to application of electric test vectors. Sub-regions (e.g., below the electric fail net region level) are identified in which systematic electric faults exist by integrating the electric diagnosis with the GDS-based techniques described herein.

According to one embodiment, a method includes detecting a plurality of electrical fault regions of a plurality of dies of a semiconductor wafer. Decomposed Graphic Database System (GDS) cross-layer clips are generated which are associated with the plurality of electrical fault regions. The method further includes identifying a plurality of cross-layer common patterns based on the decomposed GDS cross-layer clips.

In another embodiment, a systematic fault localization system includes fault localization circuitry which, in use, receives location information indicating a plurality of electrical fault regions of a plurality of dies of a semiconductor wafer. A Graphic Database System (GDS) database is included in the system and stores GDS clips associated with the plurality of dies. Graphic Database System (GDS) decomposition circuitry is communicatively coupled to the fault localization circuitry and to the GDS database. In use, the GDS decomposition circuitry: accesses, from the GDS database, GDS clips associated with each of the electrical fault regions, and each of the GDS clips represents a layer of the dies in a respective one of the electrical fault regions; generates merged GDS cross-layer clips for each of the electrical fault regions by merging the GDS clips associated with each of the respective electrical fault regions; and generates decomposed GDS cross-layer clips associated with the plurality of electrical fault regions by dividing the merged GDS clips into a plurality of decomposed GDS cross-layer clips.

In yet another embodiment, a method includes applying, by a wafer testing apparatus, electrical test vectors to a plurality of dies of a semiconductor wafer. The method further includes detecting, by fault localization circuitry, a plurality of electrical fault regions in response to the applying the electrical test vectors. GDS clips associated with each of the detected electrical fault regions are retrieved by Graphic Database System (GDS) decomposition circuitry, with each of the GDS clips representing a layer of the dies in a respective one of the electrical fault regions. The GDS decomposition circuitry generates merged GDS cross-layer clips for each of the electrical fault regions by merging the GDS clips associated with each of the respective electrical fault regions. The method further includes generating, by the GDS decomposition circuitry, decomposed GDS cross-layer clips associated with the plurality of electrical fault regions by dividing the merged GDS clips into a plurality of decomposed GDS cross-layer clips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A systematic fault localization system, comprising:
   fault localization circuitry which, in use, receives location information indicating a plurality of electrical fault regions of a plurality of dies of a semiconductor wafer;
   a Graphic Database System (GDS) database which stores GDS clips associated with the plurality of dies;
   Graphic Database System (GDS) decomposition circuitry communicatively coupled to the fault localization circuitry and to the GDS database, the GDS decomposition circuitry, in use:
      accesses, from the GDS database, GDS clips associated with each of the electrical fault regions, each of the GDS clips representing a layer of the dies in a respective one of the electrical fault regions; and
      generates decomposed GDS cross-layer clips associated with the plurality of electrical fault regions; and
   a systematic cross-layer pattern circuitry, which in use:
      identifies a plurality of cross-layer common patterns based on the decomposed GDS cross-layer clips;
      compares each of the cross-layer common patterns with all others of the cross-layer common patterns and calculates a first normalized ratio based on the comparison; and
      compares each of the cross-layer common patterns with all of the plurality of electrical fault regions of the plurality of dies and calculates a second normalized ratio based on the comparison.

2. The systematic fault localization system of claim 1, wherein the systematic cross-layer pattern circuitry, in use, identifies the plurality of cross-layer common patterns by identifying matching patterns in the decomposed GDS cross-layer clips.

3. The systematic fault localization system of claim 1, wherein the systematic cross-layer pattern circuitry, in use:
   determines a normalized differential for each of the cross-layer common patterns by subtracting the second normalized ratio from the first normalized ratio.

4. The systematic fault localization system of claim 3, wherein the fault localization circuitry, in use, identifies locations of hotspots in each of the dies based on the determined normalized differentials.

5. The systematic fault localization system of claim 1, further comprising:
   a wafer testing apparatus, which in use, applies electrical test vectors to the plurality of dies of the semiconductor wafer, wherein the fault localization circuitry indicates the plurality of electrical fault regions in response to the electrical test vectors.

6. A method, comprising:
   applying, by a wafer testing apparatus, electrical test vectors to a plurality of dies of a semiconductor wafer;
   detecting, by fault localization circuitry, a plurality of electrical fault regions in response to the applying the electrical test vectors;
   retrieving, by Graphic Database System (GDS) decomposition circuitry, GDS clips associated with each of the detected electrical fault regions, each of the GDS clips representing a layer of the dies in a respective one of the electrical fault regions;
   generating, by the GDS decomposition circuitry, from the GDS clips retrieved by the GDS decomposition circuitry, decomposed GDS cross-layer clips associated with the plurality of electrical fault regions;
   identifying a plurality of cross-layer common patterns based on the decomposed GDS cross-layer clips;
   comparing each of the cross-layer common patterns with all others of the cross-layer common patterns and calculating a first normalized ratio based on the comparison; and
   comparing each of the cross-layer common patterns with all of the plurality of electrical fault regions of the plurality of dies and calculating a second normalized ratio based on the comparison.

7. The method of claim 6, wherein the identifying a plurality of cross-layer common patterns comprises identifying the cross-layer common patterns by identifying matching patterns among the decomposed GDS cross-layer clips.

8. The method of claim 6, further comprising:
determining a normalized differential for each of the cross-layer common patterns based on the first and second normalized ratios.

9. The method of claim 8, wherein determining the normalized differential for each of the cross-layer common patterns based on the first and second normalized ratios comprises determining the normalized differential for each of the cross-layer common patterns by subtracting the second normalized ratio from the first normalized ratio.

10. The method of claim 9, further comprising:
identifying locations of hotspots in each of the dies based on the determined normalized differential.

11. The method of claim 9, further comprising:
comparing the normalized differential to a threshold value;
classifying a cross-layer common pattern as a systematic cross-layer common pattern in response to the normalized differential for the cross-layer common pattern exceeding the threshold value; and
identifying locations of hotspots in each of the dies based on the systematic cross-layer common pattern.

12. The method of claim 11 wherein the identifying locations of hotspots in each of the dies includes identifying locations of each of the dies having a pattern that matches the systematic cross-layer pattern.

13. The method of claim 12, further comprising:
generating a systematic hotspot distribution for the plurality of dies and determining respective accumulations of hotspots at each of the identified locations.

14. The method of claim 6, further comprising identifying systematic hotspot regions by stacking the detected electrical fault regions according to locations of the detected electrical fault regions on the plurality of dies.

15. The method of claim 14, wherein the generating the decomposed GDS cross-layer clips associated with the plurality of electrical fault regions includes generating the decomposed GDS cross-layer clips associated with the systematic hotspot regions.

16. A method, comprising:
detecting, by fault localization circuitry, a plurality of electrical fault regions in a plurality of dies;
retrieving, by Graphic Database System (GDS) decomposition circuitry, GDS clips associated with each of the detected electrical fault regions;
generating, by the GDS decomposition circuitry, from the GDS clips retrieved by the GDS decomposition circuitry, decomposed GDS cross-layer clips associated with the plurality of electrical fault regions;
identifying a plurality of cross-layer common patterns based on the decomposed GDS cross-layer clips;
comparing each of the cross-layer common patterns with all others of the cross-layer common patterns and calculating a first normalized ratio based on the comparison; and
comparing each of the cross-layer common patterns with all of the plurality of electrical fault regions of the plurality of dies and calculating a second normalized ratio based on the comparison.

17. The method of claim 16, wherein the identifying a plurality of cross-layer common patterns comprises identifying the cross-layer common patterns by identifying matching patterns among the decomposed GDS cross-layer clips.

18. The method of claim 16, further comprising:
determining a normalized differential for each of the cross-layer common patterns by subtracting the second normalized ratio from the first normalized ratio.

19. The method of claim 18, further comprising:
identifying locations of hotspots in each of the dies based on the determined normalized differential.

20. The method of claim 19, further comprising:
comparing the normalized differential to a threshold value;
classifying a cross-layer common pattern as a systematic cross-layer common pattern in response to the normalized differential for the cross-layer common pattern exceeding the threshold value; and
identifying locations of hotspots in each of the dies based on the systematic cross-layer common pattern.

\* \* \* \* \*